United States Patent [19]

Yasuda et al.

[11] Patent Number: 5,430,304
[45] Date of Patent: Jul. 4, 1995

[54] BLANKING APERTURE ARRAY TYPE CHARGED PARTICLE BEAM EXPOSURE

[75] Inventors: Hiroshi Yasuda; Yasushi Takahashi; Yoshihisa Oae; Tomohiko Abe; Shunsuke Fueki, all of Kawasaki, Japan

[73] Assignee: Fujitsu Limited, Kawasaki, Japan

[21] Appl. No.: 327,810

[22] Filed: Oct. 24, 1994

Related U.S. Application Data

[63] Continuation of Ser. No. 31,847, Mar. 16, 1993, abandoned.

[30] Foreign Application Priority Data

Mar. 17, 1992 [JP] Japan .................. 4-060164

[51] Int. Cl.[6] .............................. H01J 37/302
[52] U.S. Cl. .................. 250/492.22; 250/396 R
[58] Field of Search .......... 250/492.22, 396 R, 398, 250/492.2, 492.3

[56] References Cited

U.S. PATENT DOCUMENTS

| | | | |
|---|---|---|---|
| 4,153,843 | 5/1979 | Pease | 250/396 R |
| 4,980,567 | 12/1990 | Yasuda et al. | 250/398 |
| 5,144,142 | 9/1992 | Fueki et al. | 250/396 R |
| 5,194,741 | 3/1993 | Sakamoto et al. | 250/400 |
| 5,215,623 | 6/1993 | Takahashi et al. | 156/644 |
| 5,260,579 | 11/1993 | Yasuda et al. | 250/492.2 |

Primary Examiner—Jack I. Berman
Assistant Examiner—James Beyer
Attorney, Agent, or Firm—Staas & Halsey

[57] ABSTRACT

A charged particle beam-exposure method in which a subject is exposed to a pattern via a charged particle beam having an on/off exposure characteristic. A blanking aperture array has n open/close devices which individually/correspond to respective scan positions of the charged particle beam and operate to control the on/off exposure characteristic of the charged particle beam. The method includes: (1) selectively designating bit positions of successive n-bit width data blocks of the pattern, each n-bit width data block stored within a row of the pattern; (2) successively reading each n-bit width data block; (3) forming successive rows of unit pattern data from the successively designated and read n-bit width data block, each successive row corresponding to a successively designated and read n-bit width data block; (4) storing the successive rows of unit pattern data to form unit pattern data in bit matrix form having m columns and n rows; and (5) sequentially supplying the successive rows of unit pattern data to the blanking aperture array to control the on/off exposure characteristic of the charged particle beam.

11 Claims, 13 Drawing Sheets

BLANKING APERTURE ARRAY TYPE CHARGED PARTICLE BEAM EXPOSURE

This application is a continuation of application Ser. No. 08/031,847, filed Mar. 16, 1993, now abandoned.

BACKGROUND OF THE INVENTION a) Field of the Invention

The present invention relates to charged particle beam exposure, and more particularly to a charged particle beam exposure method using a blanking aperture array.

b) Description of the Related Art

ICs are now expected to be the kernel of technical advancement in all industrial fields. The integration density of ICs improves about four times in two or three years. For example, the integration of dynamic random access memories DRAMs has been improved from 1M, 4M, 16M, 64M, 256 M and to 1G.

Such high integration relies greatly upon fine pattern lithography. An optical technology has advanced to allow a fine patterning of 0.5 $\mu$m line width. However, the optical technology has a limit in the order of about 0.3 $\mu$m line width. A high precision has gradually become difficult in forming a contact hole and aligning it with an underlying pattern.

With electron beam exposure, a fine patterning of 0.1 $\mu$m line width or thinner can be performed at an alignment precision of 0.005 $\mu$m or better. With the block exposure or the blanking aperture array type exposure proposed by some of the present inventors and others, throughput of 1 cm$^2$/1 sec can be expected. In the block exposure, an electron beam is shaped in a desired pattern by a stencil (selective transmission) mask and applied to an exposure surface. In the blanking aperture array type exposure, an exposure surface is scanned on a row unit basis by an electron beam passed through a mask having a number of apertures each of which can control the electron beam to transmit or intercept.

The electron beam exposure has prominent advantages over other lithography techniques, when taking into consideration the prospective improvement in any one of fine patterning, alignment precision, turn around, reliability, and software.

The electron beam exposure generally one of a point beam, a variable rectangle shaped beam, a block pattern beam, or the like. Each electron beam is required to be controlled in accordance with a desired pattern to be exposed on a particular area of a wafer.

An electron beam exposure apparatus capable of performing a block exposure will be described with reference to FIG. 13.

The exposure apparatus is divided mainly into an exposure unit 10 and a control unit 50. The exposure unit generates an electron beam, shapes it in a spot or pattern, and exposes a desired area of a subject, The control unit 50 generates control signals for controlling the exposure unit 10. Under the exposure unit 10, a stage 35 is provided on which a subject W to be exposed is placed.

First, the exposure unit 10 will be described. Electrons generated from a cathode electrode 11 are pulled out by a grid electrode 12 and anode electrode 13. These electrodes 11, 12, and 13 constitute a charged particle beam source 14.

An electron beam generated by the charged particle beam source 14 is shaped by a first slit having, for example, a rectangular aperture. The electron beam passes a first focusing electron lens 16, and enters a slit deflector 17 which deflects the beam to adjust the beam impinging position on a stencil mask 20. The slit deflector 17 is controlled by a deflection adjusting signal S1.

In order to shape the electron beam in a desired pattern, the stencil mask 20 has a plurality of apertures, such as rectangle apertures and block apertures. The electron beam passed through the slit deflector 17 enters an electron beam shaping section whereat the beam is shaped in a desired pattern. The electron beam shaping section has second and third electron lenses 18 and 19 facing each other, the stencil mask 20 mounted between the electron lenses 18 and 19 and movably in the horizontal direction, and first to fourth deflectors 21 to 24 mounted above and under the stencil mask 20 for selecting one of the apertures of the stencil mask 20 by deflecting the electron beam in response to position data P1 to P4.

The shaped electron beam is intercepted or passed by a blanking electrode 25 to which a blanking signal SB is applied.

The electron beam passed by the blanking electrode 25 is controlled by a fourth electron lens 26, aperture 27, refocusing coil 28, and fifth electron lens 29, and enters a focus coil 80 which focuses the electron beam on the surface of the subject to be exposed. An astigmatism coil 31 corrects astigmatism.

The electron beam then enters a sixth electron lens 32 whereat the beam is controlled by a main deflector 33 and a sub-deflector 34 and applied to a desired area on the subject W to be exposed. The main deflector 33 is an electromagnetic deflector supplied with an exposure position determining signal S2, and the sub-deflector 34 is an electrostatic deflector supplied with an exposure position determining signal S3.

The subject W to be exposed is placed on the stage 35 movable in X and Y directions. The exposure unit 10 also has first to fourth alignment coils 36, 37, 38, and 39.

The control unit 50 has a memory 51 such as a magnetic tape and disk, and a central processing unit (CPU) 52. Data for designing an integrated circuit is stored in the memory 51. CPU 52 reads the data and processes it. CPU 52 also controls the whole system of the charged particle exposure apparatus.

An interface 53 transfers various exposure information from CPU 52. The exposure information includes exposure pattern information of a pattern to be exposed on a wafer W, mask information of the stencil mask 20, and other information. A data memory 54 stores the exposure pattern information and mask information transferred from the interface 53. A pattern controller 55 includes designating means, holding means, calculating means, and outputting means to perform various processes in accordance with the exposure pattern information and mask information read from the data memory 54. For example, one of such processes is a process of designating one of apertures of the stencil mask, generating position signals P1 to P4 representing the position of the designated aperture on the stencil mask, arid calculating a correction value H for correcting a difference between the pattern to be exposed and the designated aperture pattern. A DAC/AMP unit 56, having a digital-to-analog conversion function and a signal amplification function, generates a deflection adjusting signal S1 in accordance with the correction value H. A mask transport mechanism 57 moves the stencil mask 20, when necessary, in response to a signal from the pattern controller 55.

A blanking controller 58 controls a DAC/AMP unit 55 having a digital-to-analog conversion function and a signal amplification function to output the blanking signal SB from the DAC/AMP unit, in response to a signal from the pattern controller 55.

A sequence controller 60 controls the exposure sequence in accordance with the exposure pattern information sent from the interface 53. A stage transport mechanism moves the stage 35, when necessary, in response to a signal from the sequence controller 60.

The motion of the stage 35 is detected with a laser interferometer 62, and the motion information is supplied to a deflection controller 63. The deflection controller 63 calculates the exposure position on the wafer W, supplies signals to DAC/AMP units 64 and 65 DAC/AMP units 64 and 65 each have a digital-to-analog Conversion function and signal amplification function and generate the exposure position determining signals S2 and S3, respectively The deflection controller 63 also supplies a signal to the sequence controller 60.

In an ordinary electron beam exposure, the electromagnetic main deflector 33 deflects an electron beam within a main deflection field of 2 to 10 mm square, and the electrostatic sub-deflector 34 deflects an electron beam within a sub-deflection field of 100 μm square. The main deflector is used to move a beam position from one main deflection field to another main deflection field, for example, intermittently, because of its low operation speed. The sub-deflector is used to move the beam position within each sub-deflection field.

Pattern data read by CPU 52 from the memory 51 is transferred to and stored in the data memory 54. The pattern controller 55 reads the pattern data in the data memory 54 and resolves it into sub-pattern data for each exposure shot.

In accordance with the resolved sub-pattern data for each exposure, data for the main deflector 33, data for the sub-deflector 34, data for the slit deflector 17, blanking signal SB, and the like are generated to deflect the electron beam.

As described previously, some of the present inventors and others have proposed the block pattern exposure method which controls the cross sectional shape of an electron beam by using the above-described stencil mask, and the blanking aperture array type exposure method which controls a number of apertures having the same shape independently for the pattern exposure. With the latter method, a desired pattern is exposed by assigning the whole area of a subject with minute areas and by turning on and off an electron beam to each fine area.

FIG. 14A is a schematic plan view showing an example of a blanking aperture array (BAA) with a number of apertures 81 being formed in a light shielding substrate 80.

For example, at the top row LA1 shown in FIG. 14A, sixty four apertures 81 are formed, and at the next row sixty four apertures 81 are formed in a checkerboard or staggered pattern relative to those at the top row LA1. Constituting one pair by two aperture rows LA1 and LB1, similar eight pairs of aperture rows are disposed in total in the column direction.

The pattern of the mask is reduced in size by 1/500 on the surface of a specimen. Each aperture 81 is a 25 μm square. The apertures are disposed at a 50 μm pitch in the row direction, and at a 100 μm pitch in the column direction. In the column direction, one aperture row staggered from the upper and lower rows is interposed between this 100 μm pitch.

The dimension of the blanking aperture array is about 3200 μm in the row direction, and about 800 μm in the column direction. An aperture of a 25 μm square is reduced to a 0.005 μm square on the subject surface.

The whole area of a subject can be exposed by a pair of aperture rows LA1 and LB1 by applying a charged particle beam through each aperture 81 while moving the blanking aperture array in the column direction. With the eight pairs of aperture rows, the whole area of the subject can undergo a multiple exposure of eight times.

Each aperture 81 is formed with electrodes 82a and 82b on opposite sides of the aperture. The electron beam passing through the aperture 81 can be deflected to an area outside of the subject by applying suitable voltages to the electrodes 82a and 82b.

In other words, the electrodes 82a and 82b function as a shutter for an electron beam passing through the aperture 81. A blanking aperture BA is constituted by an aperture 81 and two electrodes 82a and 82b formed on respective opposite sides of the aperture.

In the example described above, 128×8 blanking apertures BA are formed. Eight blanking apertures BA are disposed in the column direction at the same column position. Therefore, the same area on the subject can be exposed eight times.

FIG. 14B is a schematic diagram illustrating a method of exposing a broad exposure area by using the blanking aperture array BAA. The exposure area is divided into a plurality of stripe areas ST1, ST2, . . . Each stripe area, for example, ST1, is divided into a plurality of crossed sub-areas SR1, SR2, . . . Each sub-area SR is formed of a series of subfields. The sub-field has a dimension, 100 μm × 100 μm, for example sufficient for the sub-deflector to scan this area as shown in righthand side of FIG. 14B.

Each sub-field is divided into a plurality of segment areas SG longer in one direction. For example, the sub-field is divided into twenty segment areas. The width of the segment area SG is set equal to or narrower than the width of the image of the blanking aperture array. In the abovedescribed example, the width is 6.4 μm or narrower.

The stage, holding a subject to be exposed, is driven vertically as indicated by a large multi-folded arrow. An electron beam passed through BAA is controlled by the sub-deflector to scan each segment area SG in the column direction indicated by a thin straight solid arrow. After scanning the segment area SG1 from the bottom to top, the next segment area SG2 is scanned from the bottom to top. When all the segment areas of the sub-field are scanned, the main deflector is driven to move to the next righthand side sub-field.

The motion of the stage indicated by the large folded arrow is 25 mm/sec, for example, and the motion of an electron beam on the exposure surface is 0.5 μm/50 nsec.

FIG. 14C illustrates how the exposure is performed by eight pairs of aperture rows of BAA. The abscissa represents time in nsec, and the ordinate represents a distance on the specimen surface in μm.

It is assumed that a specimen moves at a constant speed of 0.5 μm/50 nsec relative to the blanking aperture array. A stepwise line indicated by LA1 shows the exposure by one blanking aperture BA at the row LA1 shown in FIG. 14A.

The area on the specimen from the reference position to 0.05 μm is exposed during the first 5 nsec, and the area from 0.05 μm to 0.1 μm is exposed during the next period from 5 nsec to 10 nsec.

The area under the blanking aperture is sequentially exposed every 5 nsec, and an exposed stripe is formed in the column direction on the specimen surface.

Assuming that the specimen moves from the top to bottom of BAA shown in FIG. 14A, the area on the specimen surface at one column appears after 10 nsec under another blanking aperture staggered relative to the preceding blanking aperture.

An area which the blanking aperture row LA1 exposes, for example, is lines and spaces having 0.5 μm width and 0.1 μm pitch.

In order to expose all the area, it is necessary to use both the blanking aperture row LA1 and the next blanking aperture row LB1 disposed complementarily or in a checkerboard pattern relative to the row LA1. A broken line indicated by LB1 in FIG. 14C shows the exposure by one blanking aperture BA at the row LB1 shown in FIG. 14A.

After 20 nsec, the area exposed by the first blanking aperture row LA1 at time 0 appears under the third blanking aperture row LA2. Similarly, after 40 nsec, 60 nsec, . . . , the same area appears under-the blanking apertures BA of the successive rows. By exposing at these timings, the same area can be exposed multiple times.

The exposure speed 0.5 cm$^2$/sec is obtained for the stage motion speed 25 mm/sec. For the exposure speed 1 cm$^2$/sec, the stage motion speed is set to 50 mm/sec.

With the multiple exposure, the same area is exposed multiple times, for example, eight times. As a result, current is turned on and off in a fraction of total change, and an electron beam as a whole gradually increases and decreases. Namely, a rapid change of an exposure current can be prevented, providing an easy refocus for the compensation of the Coulomb interaction.

FIGS. 15A to 15J are schematic diagrams explaining an exposure using a blanking aperture array. For the simplicity of description, a pattern is exposed only once. In the multiple exposure, similar exposures are repeated.

It is assumed, as shown in FIG. 15A, that two rows of blanking apertures BA1 to BA5 are disposed in a staggered pattern.

The pattern to be exposed is as shown in FIG. 15B. This pattern shown in FIG. 15B is exposed on a subject. The subject is assumed to move from the top to bottom of the blanking aperture array shown in FIG. 15A.

First, as shown in FIG. 15C, the bottom areas of the subject to be exposed reach under i.e., are disposed beneath the row of blanking apertures BA1 and BA2. These apertures BA1 and BA2 are turned on to expose the areas.

At the next timing as shown in FIG. 15D, the areas to be exposed are disposed under the upper row of the three blanking apertures BA1, BA2, and BA3. These areas are then exposed.

As the second next timing as shown in FIG. 15E, the areas to be exposed are disposed under the upper row of the two blanking apertures BA1 and BA2. These areas are then exposed.

At this timing, there are other areas to be exposed, adjacent the areas under the blanking apertures BA1 and BA2. However, these other areas have no corresponding aperture at this timing, and so no exposure is performed for these other areas.

In the above manner, while the specimen moves downward under the blanking apertures BA, the areas under the blanking apertures are selectively exposed.

After exposing the three areas as shown in FIG. 15F, the two areas not exposed at the timing shown in FIG. 15E are disposed under the row of the two blanking apertures BA4 and BA5 as shown in FIG. 15G. At this timing, these areas under the blanking apertures BA4 and BA5 are exposed.

On the five columns of the pattern, the first, third, and fifth-columns are exposed using the upper row blanking apertures BA1, BA2, and BA3, and the second and fourth columns are exposed using the lower row blanking apertures BA4 and BA5 at delayed timings.

As the subject moves thereafter as shown in FIGS. 15H, 15I, and 15J, the areas to be exposed are sequentially exposed to form the pattern shown in FIG. 15B.

Using the blanking aperture array, therefore, an arbitrary pattern can be exposed.

The blanking aperture array type exposure is not a substitute for the block exposure, and instead they are both used in a compatible manner. Namely, both the block pattern and blanking aperture array may be formed on a stencil mask to expose a frequently used pattern with the block exposure and a less used pattern with the blanking aperture array exposure.

As described above, with the blanking aperture array, an arbitrary pattern can be exposed by controlling each blanking aperture when applying a charged particle beam to a particular area on the specimen surface.

However, with the blanking aperture array (BAA) method, the amount of data becomes enormous if the abovedescribed specification is applied, because one hundred and twenty eight data are transferred every 5 nsec to 2.5 nsec, and on/off information (i.e., a bit map) of 2000 rows of 256 K bits is used every 10 μsec or 5 μsec.

Such bit information is practically unable to be stored in a bit map memory, because there are $4 \times 10^5 \times 4 \times 10^5 = 160$ G cells of 0.05 μm square within a 20 mm square and it is difficult to access such a high capacity memory every 2.5 nsec.

SUMMARY OF THE INVENTION

It is an object of the present invention to provide a technique capable of generating pattern data usable in a practical level for the exposure technique such as a blanking aperture array exposure wherein a plurality of charged particle beams are independently controlled to turn on and off to expose a desired pattern on the surface of a subject.

According to one aspect of the present invention, there is provided a charged particle beam exposure method wherein a plurality of unit pattern data are prepared in parallel; the unit pattern data being a bit matrix of m rows×n columns, bit information of each unit pattern data is supplied on the row unit basis to n charged particle beam open/close means disposed substantially perpendicular to the scan direction to control the on/off of n charged particle beams independently, and the surface of a subject is sequentially exposed and scanned one row after another in the column direction to expose a two-dimensional pattern, the charged particle beam exposure method comprising the steps of: generating the unit pattern data having an n-bit width and m-bit length by reading from a pattern memory by designating-the bit positions in the row direction of the unit pattern data having the n-bit length, the pattern memory storing a plurality of patterns each in the form of a bit map having a bit width broader than n bits; and sequentially exposing for each unit pattern data by sequentially supplying the unit pattern data to the n charged particle beam open/close means.

LSI patterns have a very large number of repetitive patterns. For example, in the case of the block exposure, most of LSI patterns can be exposed by forming blocks of several tens to several hundreds on a stencil mask. It is not so difficult to store block patterns of several thousands in a memory in the form of bit map.

In a practical exposure, however, the scan width of a charged particle beam and the block pattern period are not always the same, and the block pattern period cannot be divided by an integer in many cases. If divided patterns are different although the same patterns are exposed, it requires a very large capacity of a memory.

A two-dimensional bit map having a width broader than the exposure scan width is used to select and read a desired pattern having a scan width. In this manner, the same pattern in the memory can be processed and used in various ways, reducing the memory capacity considerably.

An arbitrary rectangular pattern is generated frown rectangular pattern information coded in a predetermined format, allowing to generate patterns having no regularity such as wiring patterns.

In this case, the data overwrite is used to greatly improve the efficiency of pattern data generation.

According to the present invention, in the blanking aperture array method in which a plurality of charged particle beams are independently turned on and off in accordance with exposure information, a large number of necessary pattern data can be generated efficiently and at high speed using a simple system structure.

BRIEF DESCRIPTION OF THE DRAWINGS

FIG. 9A shows a single rectangular pattern, and FIG. 9B shows a combination of rectangular patterns.

DETAILED DESCRIPTION OF THE PREFERRED EMBODIMENTS

Figure 1:
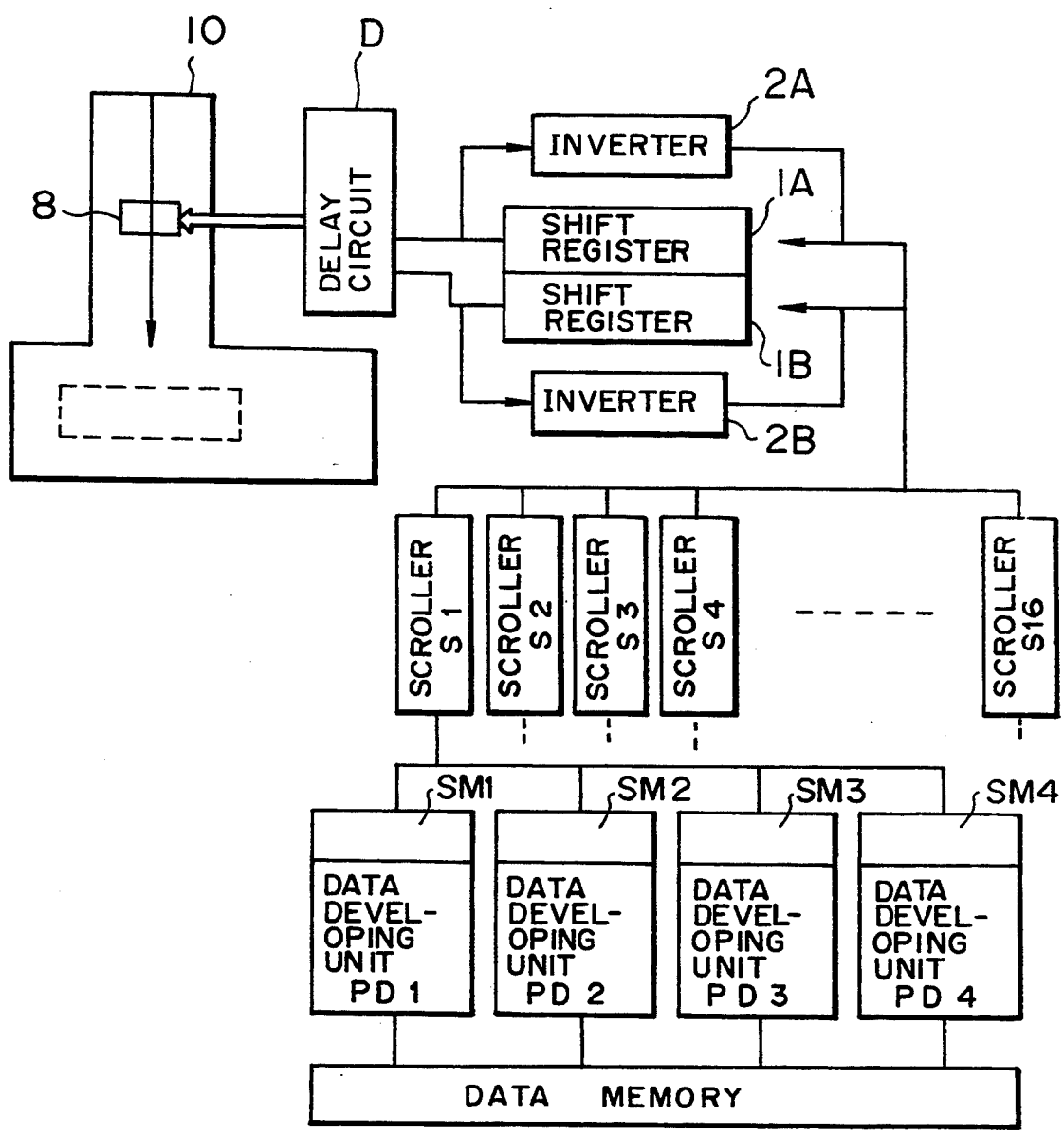
FIG. 1 is a block diagram showing an electron beam exposure apparatus according to an embodiment of the present invention.

FIG. 1 is a block diagram showing the structure of an electron beam exposure apparatus according to an embodiment of the present invention. An exposure system 10 of the electron beam exposure apparatus has a blanking aperture array 8. Pattern data is supplied via a delay circuit D to each blanking aperture of the blanking aperture array 8. Specifically, the same data is supplied at delayed timings to apertures of each column: of the blanking aperture array 8.

The delay circuit D is connected to two shift registers 1A and 1B to supply pattern data to the delay circuit D at high speed. While one of the shift registers is being used, the other prepares for the next pattern data. The two shift registers 1A and 1B are connected to scrollers, for example, sixteen scrollers S1, S2, . . . , S16 enabling to supply a set of data alternately to the two shift registers 1A and 1B.

Each scroller S is constructed basically of a circuit having the same structure as the shift register 1. Each scroller is connected to four data developing units PD and corresponding four memories SM, such as SRAMs. The number of combinations of the pattern data developing unit PD and static RAM is $4 \times 16 = 64$ in total.

Each pattern data developing unit PD receives pattern data from a data memory DM, generates pattern data :for one exposure unit, and stores the pattern data in the memory SM, such as a SRAM. The four memories SM1 to SM4 alternately supply pattern data to the corresponding stroller S.

Inverters 2A and 2B are connected to the shift resisters 1A and 1B, respectively, to invert an output of the shift register and feed it back to the input of the shift register.

Therefore, when pattern data is supplied via the data developing unit PD, scroller S, and shift register 1 to the delay circuit D, the pattern data is inverted by the inverter 2 and fed back to the shift register 1 to output this inverted pattern data after the first supplied pattern data. This inverted pattern data can be used for the ghost exposure reducing the exposure intensity.

Figure 13:
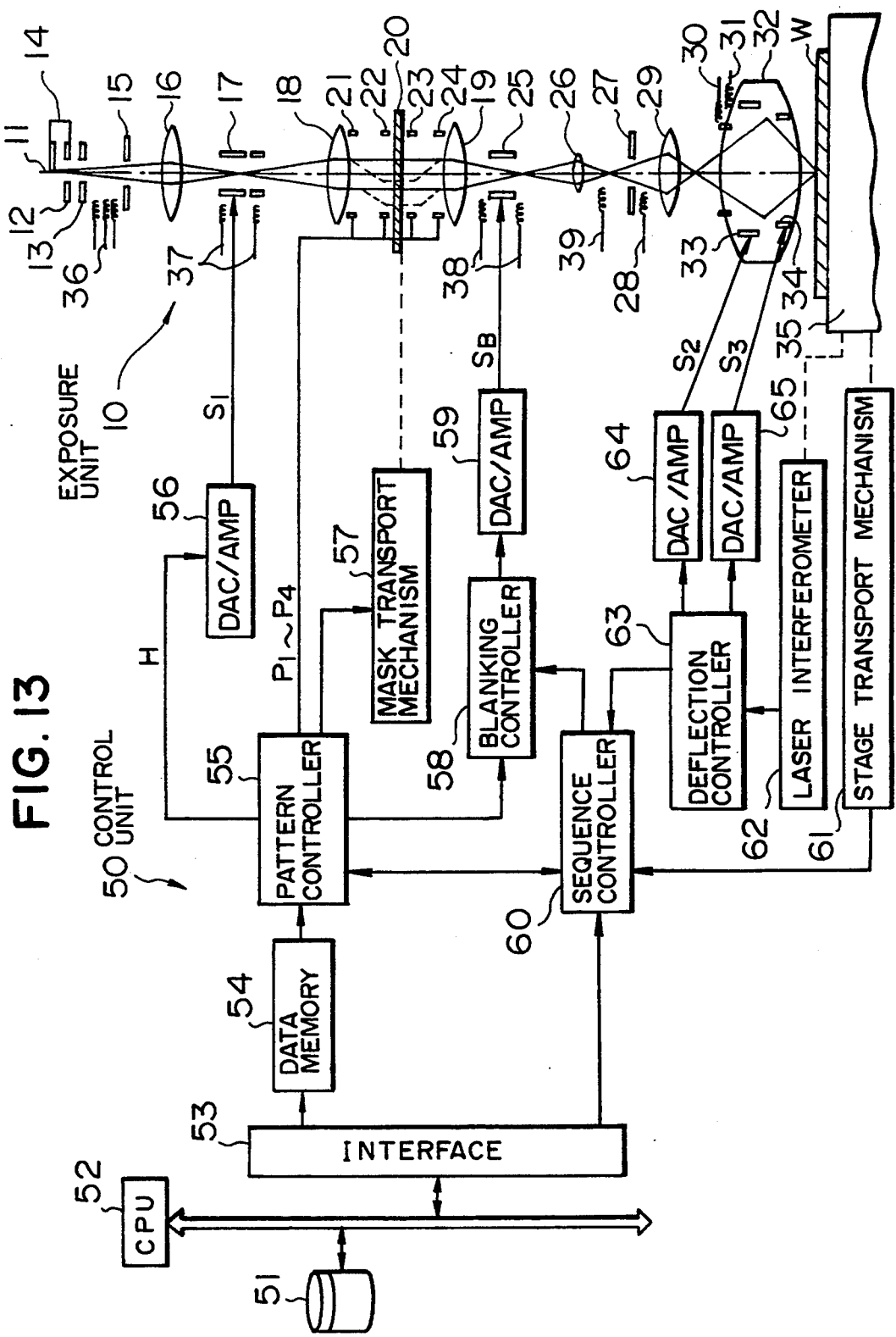
FIG. 13 is a block diagram showing the structure of a typical electron beam exposure apparatus.

The exposure system 10 may be structured by using the exposure apparatus shown in FIG. 13 with a blanking aperture array.

Figure 14A:
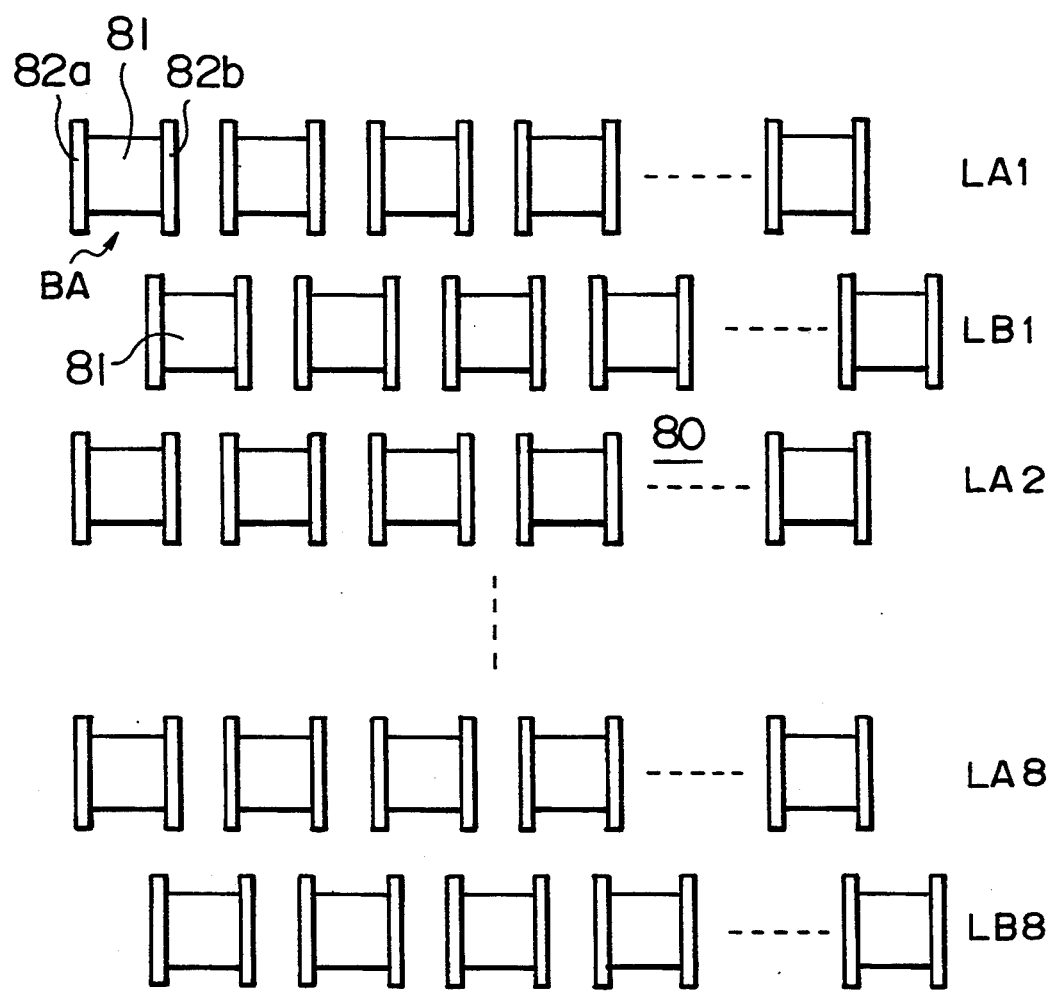
FIGS. 14A, 14B, and 14C are schematic plan views and a graph explaining a blanking aperture array.

If the blanking aperture array shown in FIG. 14A having $128 \times 8$ blanking apertures is used, the pattern data to be supplied to the blanking aperture array 8 is $128 \times m$ where m is a number defining the length of a segment area SG to be scanned by the sub-deflector. The number m is 2000, for example.

Figure 2A:
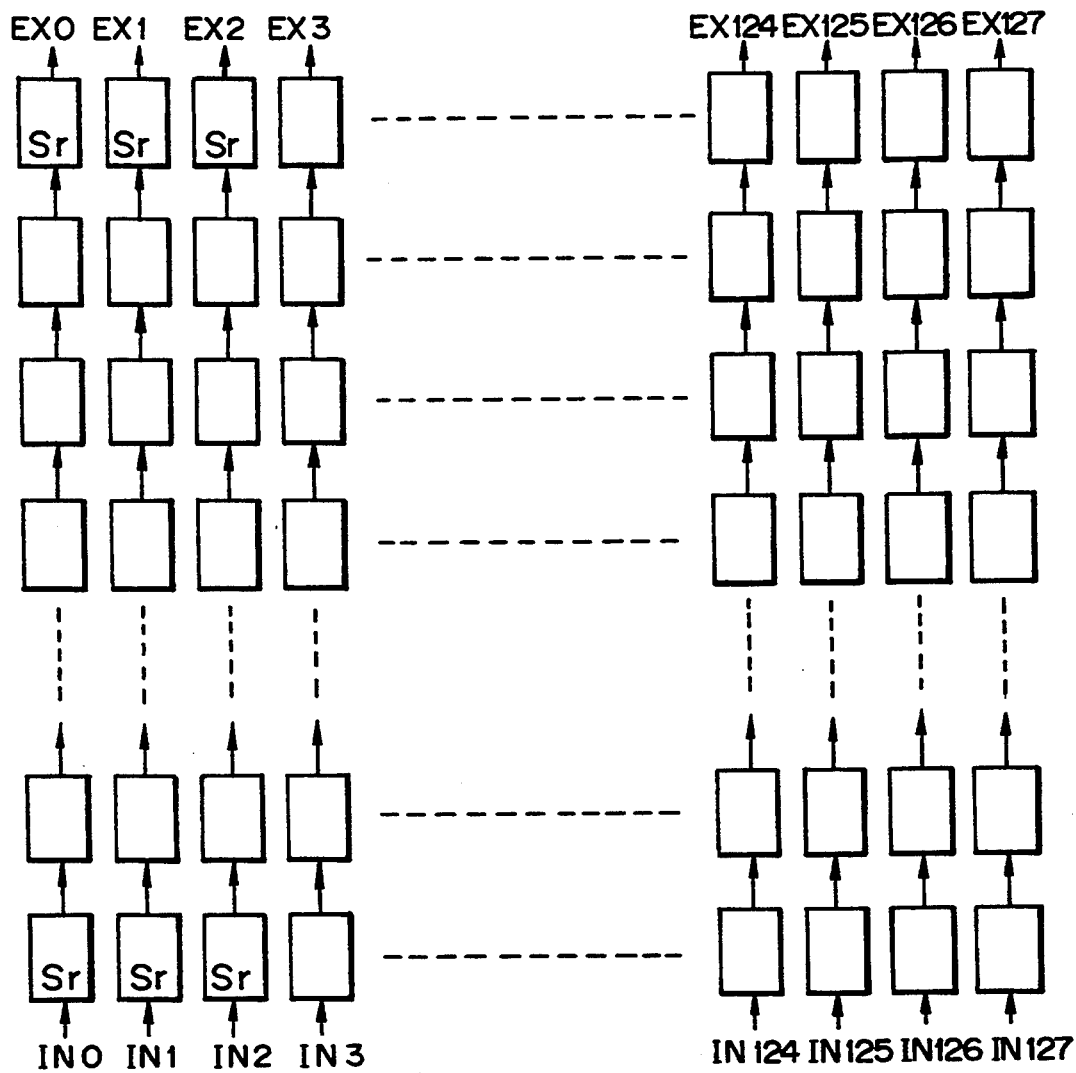
FIGS. 2A and 2B are a schematic plan view showing the structure of a scroller used with the apparatus shown in FIG. 1, and a circuit diagram showing a single scroller unit.
Figure 2B:
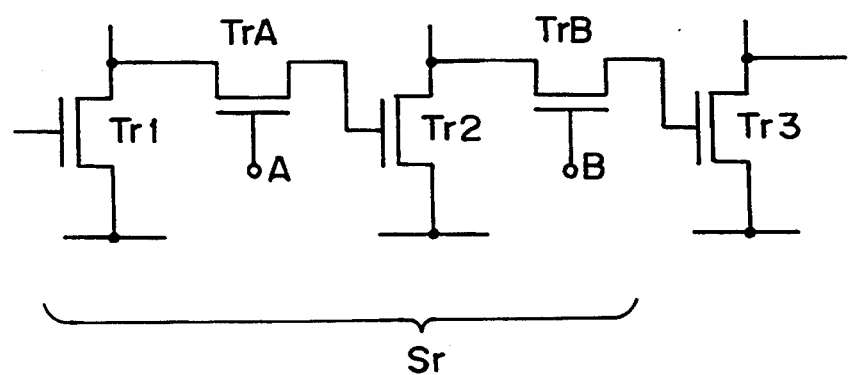

FIGS. 2A and 2B show an example of the structure of the scroller capable of transferring pattern data of $128 \times 2000$ at high speed, FIG. 2A is a block diagram showing the structure of the scroller, circuit. The scroller capable of receiving 128 pattern data IN0 to IN127 and storing serially 2000 data for each of pattern data IN0 to IN127, has 128×2000 shift registers Sr connected as shown in FIG. 2A.

128 sets of serially connected 2000 shift registers Sr are provided in parallel. This scroller can receive 128 input signals IN0 to IN127 in parallel and supply 128 output signals EX0 to EX127 in parallel.

FIG. 2B is a circuit diagram showing an example of the structure of each shift register Sr. An output signal from a transistor Tr1 is applied to the gate electrode of a transistor Tr2 at the next stage via a gate formed by a transistor TrA.

If the gate voltage at the transistor Tr1 is a high level, the output of this transistor Tr1 is a low level. When the gate TrA opens, the transistor Tr2 receives the low level output of Tr1and turns off, and thereupon outputs a high level signal. In this manner, two transistors Tr1 and Tr2 form a one step shift register. The output signals from the transistors Tr1 and Tr2 are selectively transferred to the output side by the gates TrA and TrB, respectively.

An example of the operation performing the exposure by the blanking aperture array at a practical, usable speed will be described.

Consider the case wherein the dimension of one electron beam is a 0.05 $\mu m$ square, and the exposure is performed at 1 cm$^2$/sec. In this case, $4 \times 10^{10}$ beams of 0.05 $\mu m$ square are contained within an area of 1 cm$^2$. In order to expose $4 \times 10^{10}$ beams eight times per one second, it is assumed to use beams, for example, $128 \times 8$ beams.

Figure 14B:
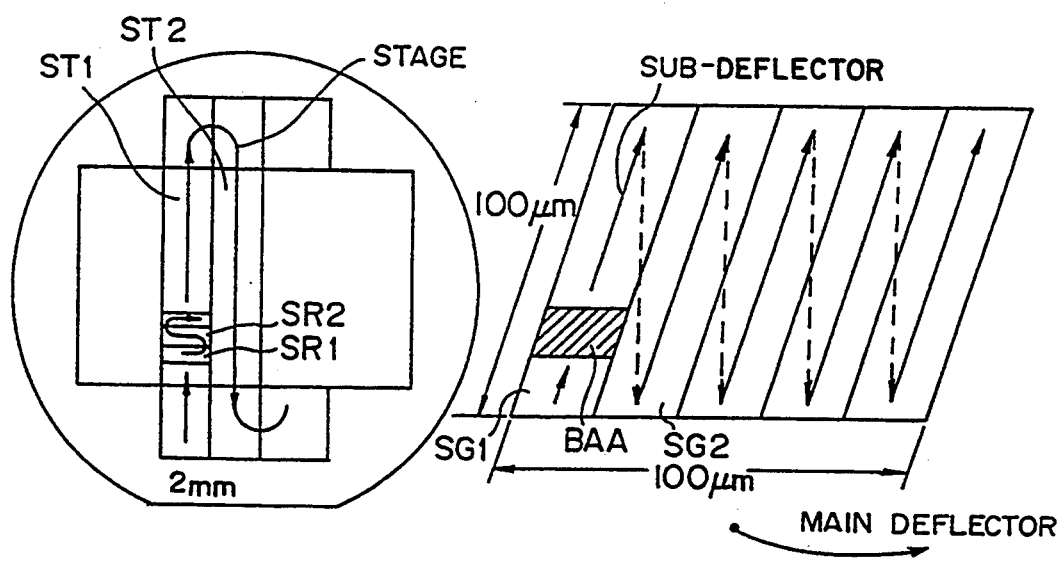
Figure 14C:
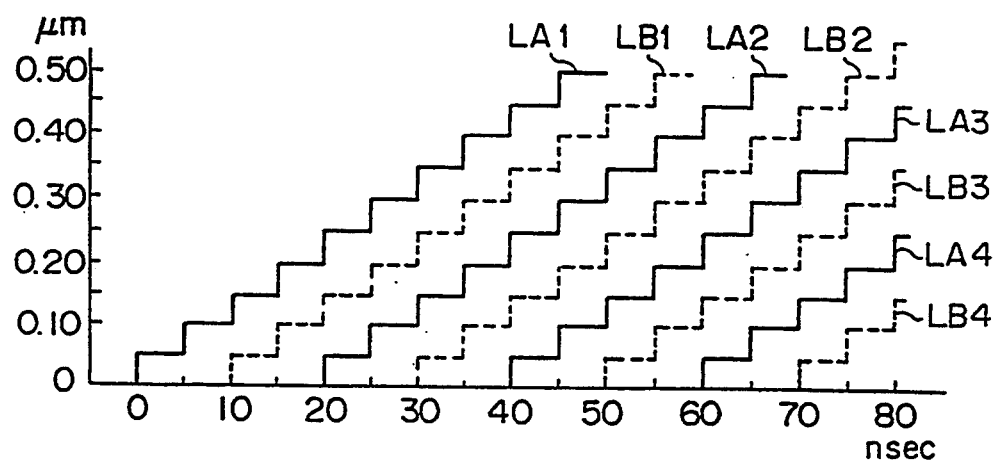
Figure 15A:
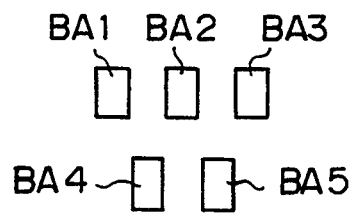
FIGS. 15A to 15J are schematic plan views explaining the exposure by a blanking aperture array.
Figure 15B:
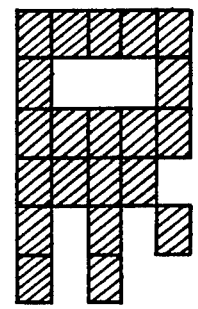
Figure 15C:
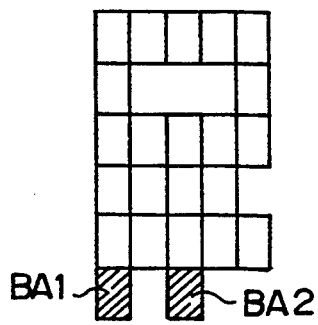
Figure 15D:
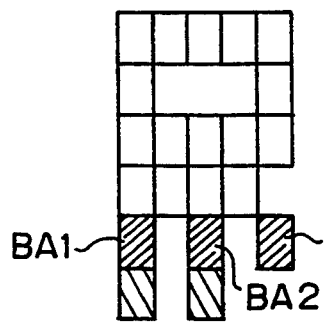
Figure 15E:
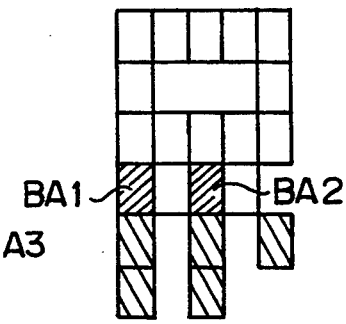
Figure 15F:
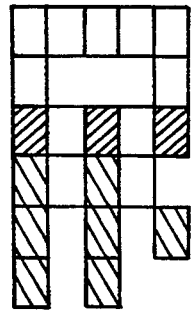
Figure 15G:
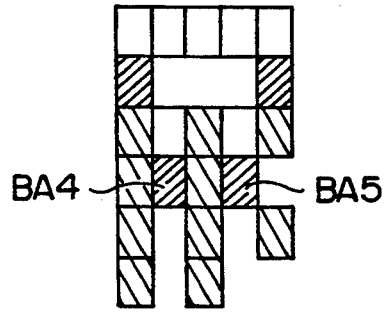
Figure 15H:
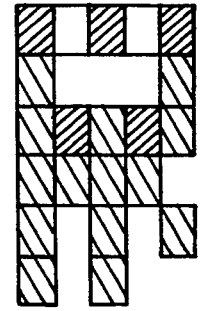
Figure 15I:
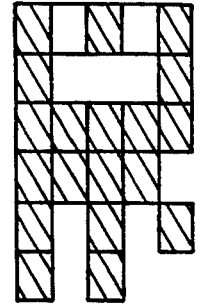
Figure 15J:
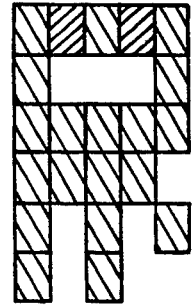

The stage on which a specimen is placed is assumed to move at about 50 mm/sec in the Y direction, as shown in FIG. 14B, and the main deflector is assumed to move the electron beam in the X-direction at 2 mm/2 msec.

The sub-deflector is assumed to move the electron beam in the Y direction at 100 $\mu m/5$ $\mu sec$. Under these conditions, the scan speed is 50 nsec and the time required for scanning 1 $\mu m$ is 50 nsec. This time corresponds to 2.5 nsec for a length of one beam of 0.05 $\mu m$. It is therefore necessary to process one shot in 2.5 nsec.

With the above-described arrangement having eight pairs of blanking aperture rows in the direction of beam advancement, eight shots are required to expose one point. The exposure for the same area is completed by eight shots, taking 20 nsec. Therefore, if a refocus for the Coulomb interaction is performed relative to the electron beam intensity, the time required for the refocus is not 2.5 nsec but 20 nsec.

If the area is exposed at 0.5 cm$^2$/sec, the stage motion speed can be halved and the sub-deflector may take two times the 5 $\mu sec$, or 10 $\mu sec$, to expose the same area. In this case, the time required for one shot is doubled to 5 nsec.

If the pattern data corresponding to one scan by the sub-deflector and supplied from one of the shift registers 1A and 1B is to be processed in 5 $\mu sec$, the data transfer period of 16 scrollors becomes $5 \times 16 = 80$ $\mu sec$. As a result, the data transfer to each scroller may take 75 $\mu sec$ with a margin of 5 $\mu sec$, and so each data of 2000 rows may be transferred in 37.5 nsec.

The data developing period of the $16 \times 4$ data developing units becomes $5 \times 64 = 320$ $\mu sec$. Therefore, each data developing unit may take about 300 $\mu sec$ in developing data. Since data can be written to SRAM in about 50 nsec, it may take 6000 steps in developing unit pattern data.

Figure 3:
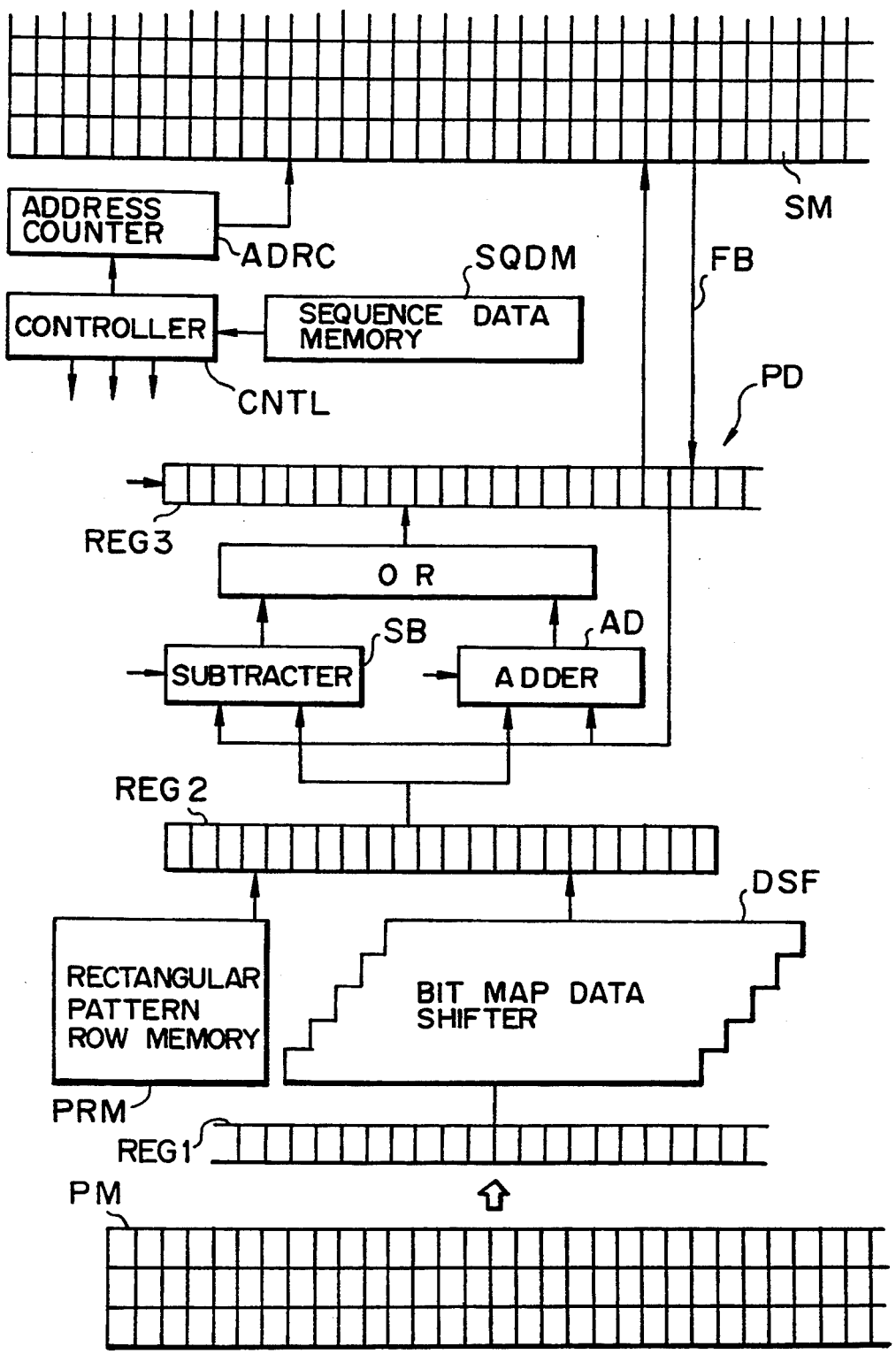
FIG. 3 is a block diagram showing the detailed structure of a data developing unit used with the apparatus shown in FIG. 1.

FIG. 3 shows an example of the structure of the data developing unit. The circuit shown in FIG. 3 corresponds to one memory SM, such as a SRAM; and one pattern data developing unit PD, respectively shown in FIG. 1. The pattern developing unit PD has a pattern memory PM for storing a plurality of repetitive patterns and a rectangular pattern row memory PRM suitable for storing rectangular patterns.

Information at each row of the pattern memory is read and loaded in a memory read register REG1, and supplied to a bit map data shifter DSF. The bit map data shifter DSF can shift the supplied information of one row a desired number of bits in the row direction. The shifted row information is transferred to an intermediate register REG2.

The intermediate resister REG2 can receive rectangular pattern row data, recovered from rectangular pattern information stored in the rectangular pattern row memory, in a predetermined format.

The intermediate register REG2 supplies its output signal to an adder AD and subtracter SB. An output of the adder AD or subtracter SB is supplied to an OR gate whose output is supplied to a register REG8 to which data can be overwritten. Data in the register REG3 is supplied to the memory SM, such as a SRAM, The read/write address of the memory SM is controlled by an address counter ADRC which is controlled by a controller CNTL in accordance with the information read from a sequence data memory SQDM. The controller CNTL also generates control signals for other circuit elements.

A feedback means FB is provided to feed back the last row information stored in the static random access memory SM to the register REG3.

The pattern memory PM stores frequently used patterns in the form of bit map, Pattern data read from the pattern memory PM is shifted in the row direction by the bit map data shifter DSF, and written in the static random access memory SM.

Figure 9A:
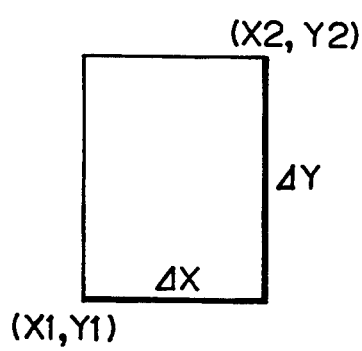
FIGS. 9A and 9B are plan views explaining rectangular pattern data.

As shown in FIG. 9A, a rectangular pattern can be defined by a start point (X1, Y1) and end point (X2, Y2), or by the start point (X1, Y1) and side lengths ($\Delta X$, $\Delta Y$). In this case, all data within a rectangular pattern may be stored in the form of bit map. However, a rectangular pattern has a high possibility that a pattern at one row will appear at succeeding rows.

In view of this, it is more efficient to store only the information of each row where any change occurs. The first row of a rectangular pattern is supplied to the register REG3 and to the static random access memory SM, and the same pattern is fed back via the feedback means FB to the register REG3.

Only the succeeding pattern data changed from the preceding pattern data is written. A new pattern is supplied to the adder AD and added to the previous pattern. When the old pattern is to be deleted, the pattern data is supplied to the subtracter SB and subtracted from the previous pattern.

With such an arrangement, data is transferred twice for the start and end row of a rectangular pattern. The register REG3 receives the addition or subtraction result of the adder AD or subtracter SB executed in response to a control signal from the controller CNTL.

Reading bit map data from the pattern memory PM and forming a rectangular pattern using the data in the rectangular pattern row memory, will be detailed below.

Figure 4A:
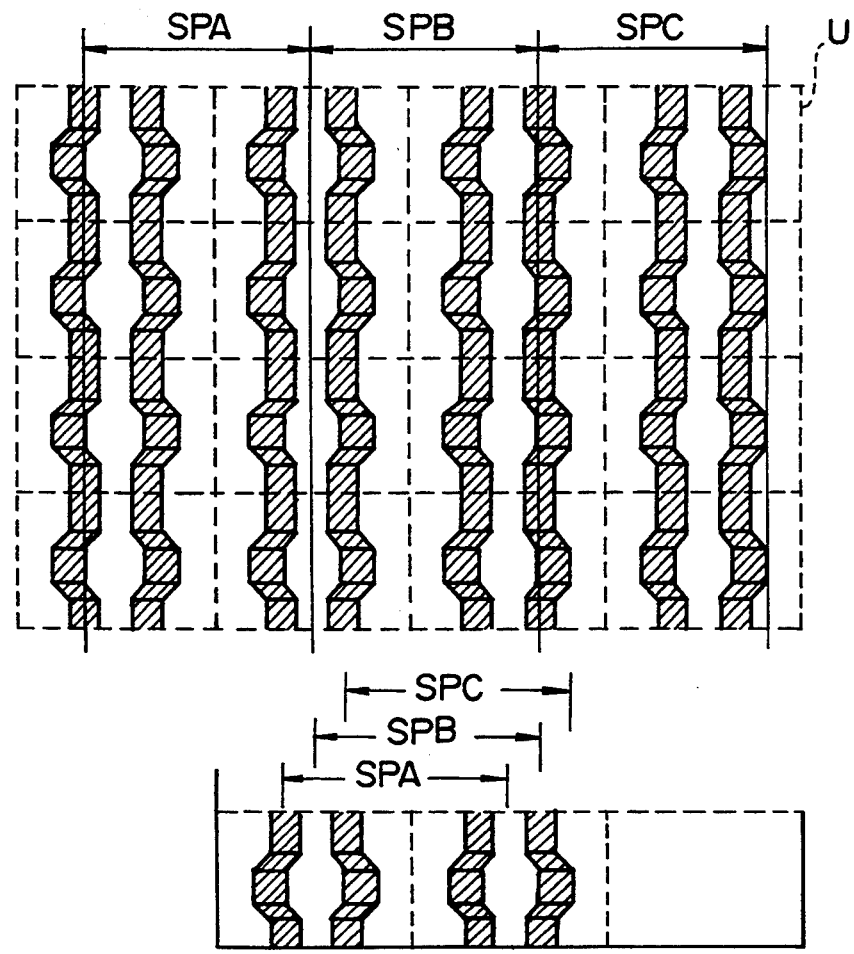
FIGS. 4A and 4B are plan views showing examples of the structure of bit maps.
Figure 4B:
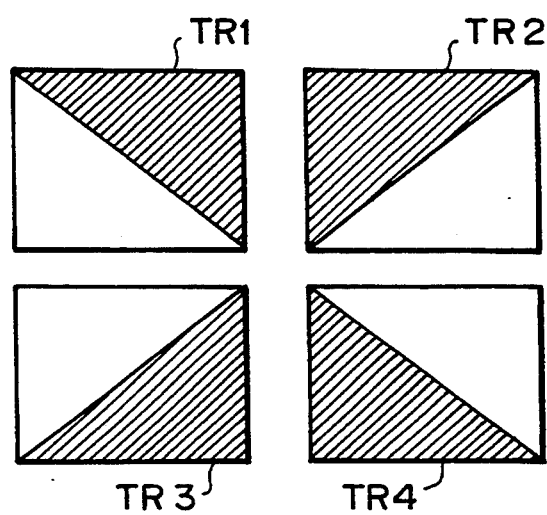

FIGS. 4A and 4B are diagrams explaining the read operation of a bit map from the bit map pattern memory PM.

FIG. 4A shows an example of a wiring pattern on a DRAM or the like which is a typical repetitive pattern. This typical repetitive pattern is formed by repeating a unit pattern U on the two-dimensional plane, as seen from the upper diagram in FIG. 4A.

The scan width of the electron beam exposure apparatus is different from the repetitive pattern period. If the repetitive pattern is divided at the scan width pitch, stripe patterns SPA, SPB, and SPC are obtained. If these different stripe patterns SPA, SPB, and SPC are to be stored in the memory, the capacity of the memory becomes enormous.

As shown in the lower diagram in FIG. 4A, the pattern memory has a sufficiently broader width (e.g., 220 bits) than one scan width (e.g., 128 bits). In reading the stripe pattern SPA, the bit map stored in the pattern memory is shifted in the row direction (in the lateral direction) by a predetermined number of bits and only the necessary bit width area of SPA is read.

Similarly, in reading the stripe pattern SPB or SPC, the bit map is shifted by a necessary number of bits and only the necessary bit width area of SPB or SPC is read.

FIG. 4B shows examples of bits maps of triangular patterns. Four triangular patterns Tr1, Tr2, Tr8, and Tr4 are congruent, but the directions are different. Triangular patterns analogous to these triangular patterns can be obtained by shifting these triangular patterns. For example, by shifting the triangular pattern Tr1 to the right, a smaller triangular pattern can be obtained.

Figure 5:
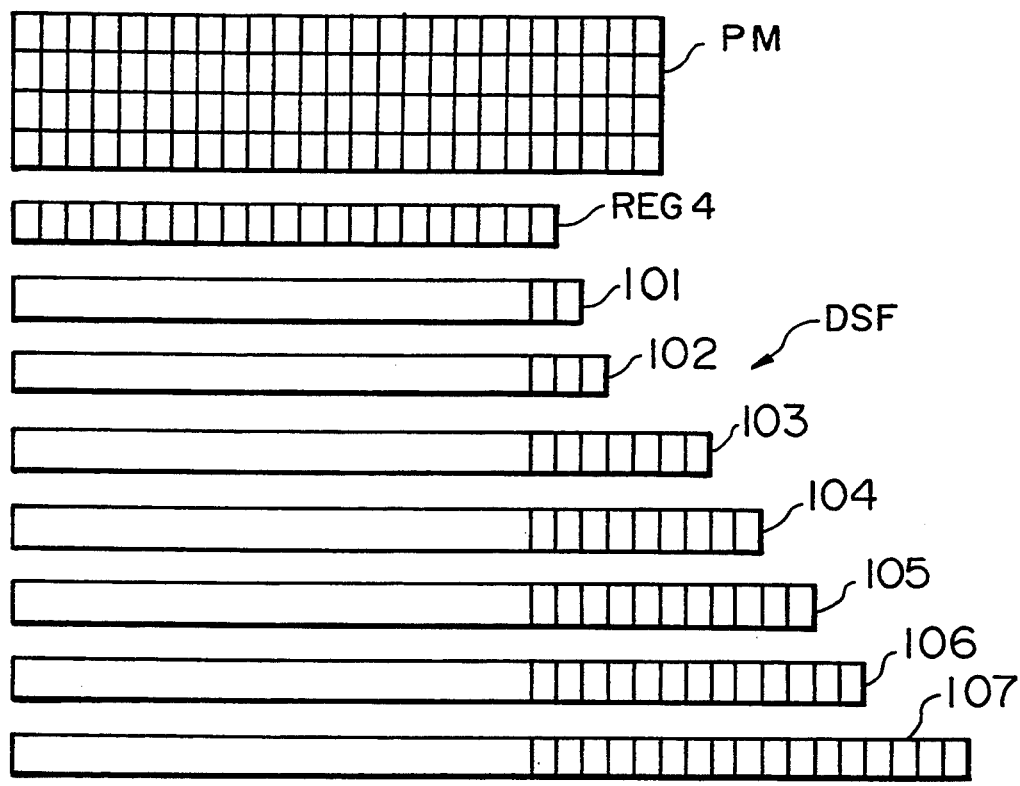
FIG. 5 is a block diagram schematically showing the structure of a bit map data shifter.

FIG. 5 shows an example of the structure of the bit map data shifter. The data read register REG4 reads data of one row from the pattern memory PM. A 1-bit shifter 101 shifts the inputted one row data one bit to the right, or outputs the inputted one row data without shifting. Similarly, a 2-bit shifter 102, 4-bit shifter 103, 8-bit shifter 104, 16-bit shifter 105, 32-bit shifter 106, and 64-bit shifter 107 shift the inputted data 2 bits, 4 bits, 8 bits, 16 bits, 32 bits, and 64 bits to the right, respectively, or output the inputted data without shifting.

In the above example, the shifters shift the inputted data to the right. Shifters for shifting to the left, or shifters for shifting upward and downward, may also be used. A combination of these shifters allows one row data to shift in the row direction and column direction an optional number of bits.

Figure 6:
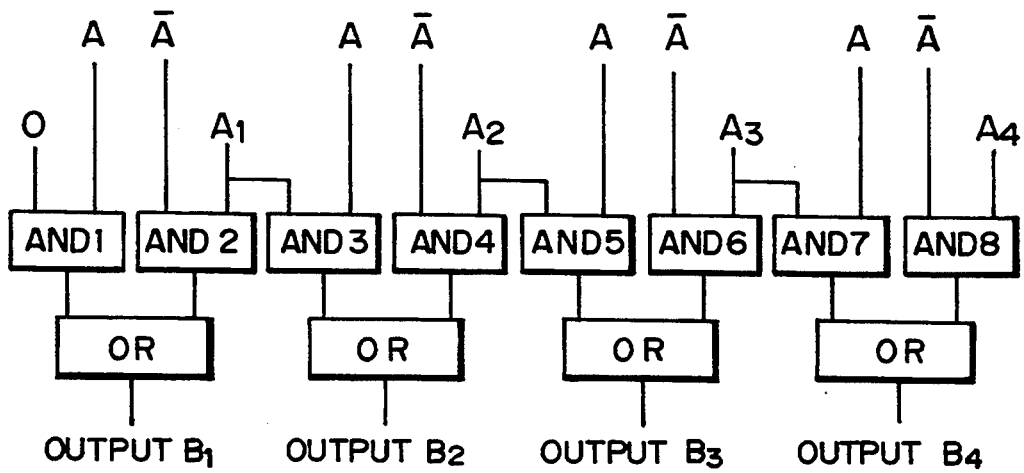
FIG. 6 is a block diagram showing a one-bit shifter.

FIG. 6 shows an example of the structure of a 1-bit shifter. One row input signals are represented by A1, A2, A3, A4, ... A and 1A are a 1-bit signal indicating whether a bit shift is performed or not. A = 1 if a bit shift is to be performed, and A = 0 if a bit shift is not performed. 1A is an inverted signal of A.

For example, if a bit shift A = 1 is instructed, "1" is supplied to odd-numbered AND gates so that each input signal A1, A2, ... is supplied via each right side AND gate to each OR gate. In this case, 1A = 0 and so even-numbered AND gates inhibit the data pass.

If a bit shift A = 0 is not executed, "1" is supplied to the even-numbered AND gates so that each input signal A1, A2, ... is supplied via its AND gate to each OR gate.

An n-bit shifter can be structured by changing connections between AND gates of the 1-bit shifter described above.

Figure 7:
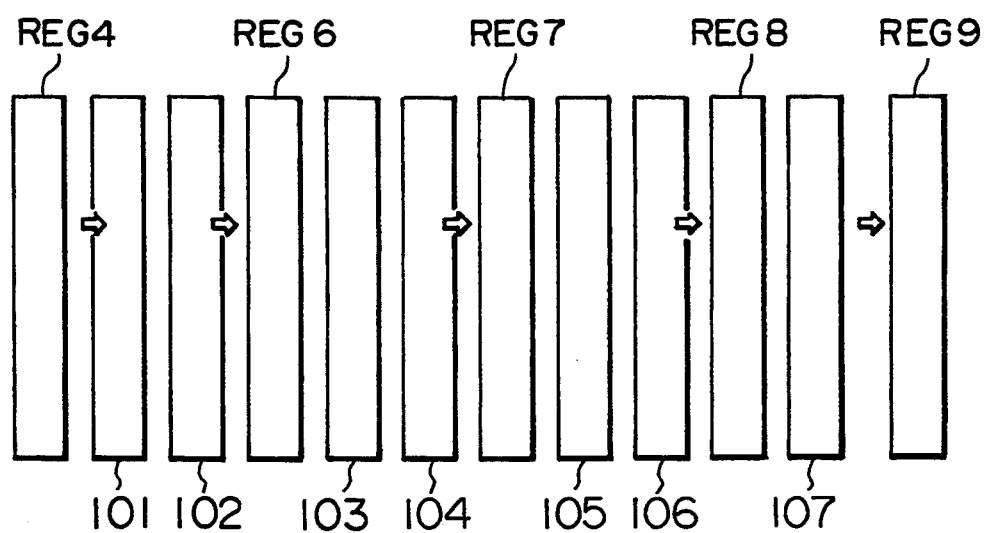
FIG. 7 is a block diagram showing an example of a pipeline structure of the bit map data shifter.

The bit shifters shown in FIG. 5 may be simply connected serially, or if a delay time becomes serious at each stage, they may be pipelined by inserting registers as shown in FIG. 7.

Referring to FIG. 7, one row data read from the pattern memory PM is temporarily stored in the register REG4, and then supplied to the 1-bit shifter 101 and 2-bit shifter 102. A register REG6 is inserted between the 2-bit shifter 102 and 4-bit shifter 103. Similarly, a register REG7 is inserted between the 8-bit shifter and 16-bit shifter 105, and a register REG8 is inserted between the 32-bit shifter 106 and 64-bit shifter 107. An output of the 64-bit shifter 107 is stored in a register REG9. The number of stages of the pipeline may be changed with a delay time.

Figure 8:
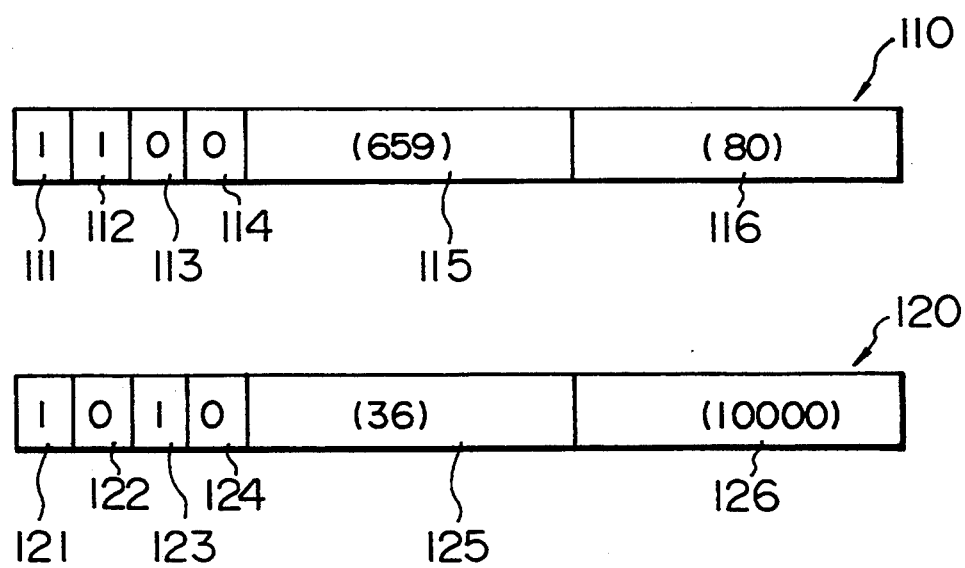
FIG. 8 is a schematic diagram showing pattern memory sequence data.

FIG. 8 shows the format of data stored in the sequence data memory SQDM shown in FIG. 3, this data representing the contents of a bit map relative to each preceding row data. The sequence data is constructed of two 32-bit signals, for example.

The first 32-bit data has a 1-bit data 111 indicating sequence data, a 1-bit data 112 indicating X/Y direction data, a 1-bit data 118 indicating a presence/absence of a count-up, and a 1-bit data indicating addition/subtraction. The 1-bit data 111 takes "1" for the same pattern, and "0" when the same pattern ends. The 1-bit data 112 indicating X/Y direction data takes "1" for the Y data, and "0" for the X data. The 1-bit data 113, indicating the count-up, takes "1" for the count-up of the address counter. The 1-bit data 114, indicating addition/subtraction, takes "0" for the addition, and "1" for the subtraction. Four 1-bit data 121 to 124 of the second 32-bit data 120 are the same as the four 1-bit data of the first 32-bit data 110.

Similarly, the second 32-bit data 120 has a 1-bit data 121 indicating sequence data, a 1-bit data 122 indicating X/Y direction data, a 1-bit count-up data 128, and a 1-bit addition/subtraction data 124. In this case, the X/Y data 122 is not "0" so that the data is X data, the count-up data 123 is "1" so that the memory has counted up, and the addition/subtraction data 124 is not "0" so that the addition is performed.

The next 14-bit data 125 indicates the number of shift bits of the read data. In the example shown in FIG. 8, the read data is shifted 36 bits. The second next 14-bit data 126 indicates the address of the bit map to be read. The address "10000" in this example indicates, for example, the repetitive wiring pattern shown in FIG. 4A.

Figure 9B:
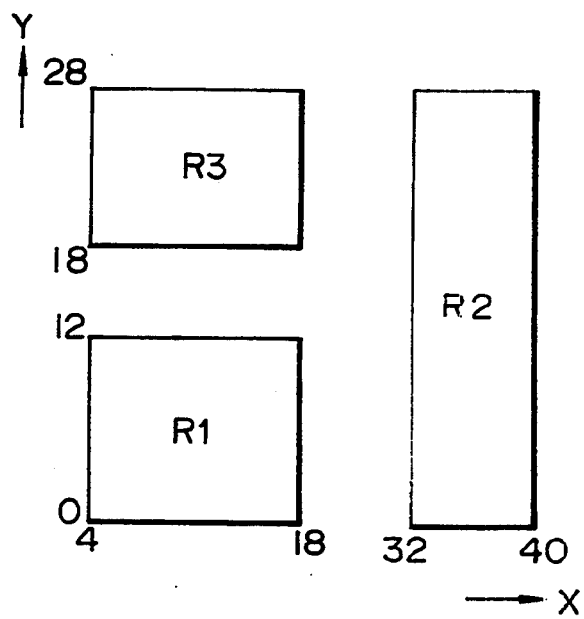

FIG. 9B shows examples of a combination of rectangular patterns. The X direction is in the lateral direction in FIG. 9B, and the Y direction is in the direction perpendicular to the X direction. A rectangular pattern R1 has a start point (4,0) and end point (18, 12). Similarly, a rectangular pattern R2 has a start point (32, 0) and end point (40, 28), and a rectangular pattern R3 has a start point (4, 18) and end point (18, 28).

A bit map of such a rectangular pattern may be defined by the start and end points, or by the start point and side lengths. However, since the same row pattern appears repetitively, assuming that the electron beam scan direction is the Y direction, a bit map may be defined by supplying only the information of a row pattern different from a reference row pattern unit.

For example, the unit area of this embodiment is 128 bits×2000 bits, and so a reference row pattern is represented by a row of 128 bits.

Figure 10:
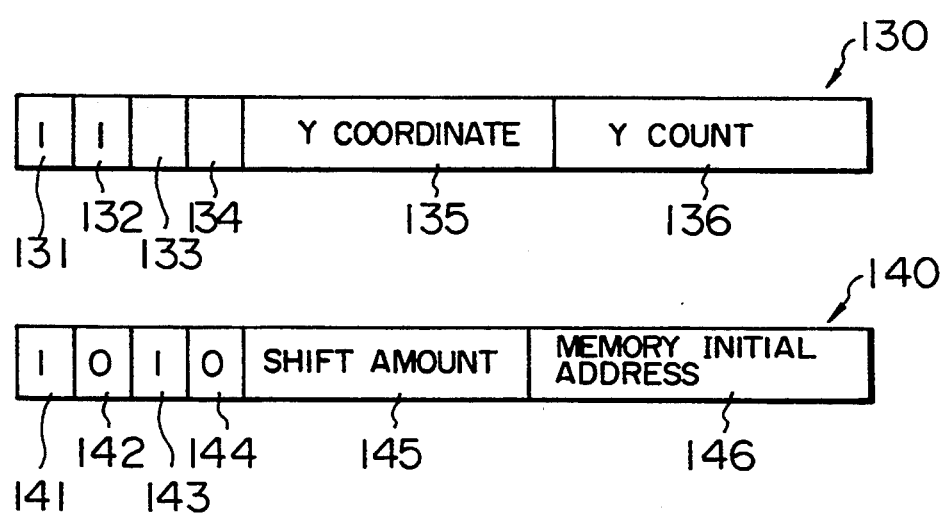
FIG. 10 is a schematic diagram showing an example of row memory sequence data.

FIG. 10 shows an example of sequence data for forming a row unit pattern. The sequence data is represented by two 32-bit signals 130 and 140, for example.

The first 32-bit data 130 includes as the header a 1-bit data 131 indicating sequence data, a 1-bit signal 132 indicating X/Y data, a 1-bit data 133 indicating a presence/absence of counter count-up, and a 1-bit data 134 indicating addition/subtraction.

The sequence bit data 131 takes "1" for the same row data, and "0" when the same row data ends. The 1-bit data 132 indicating X/Y direction data takes "1" for the Y data, and "0" for the X data. The 1-bit data 113 indicating the count-up takes "1" for the count-up of the address counter, and "0" for no count-up.

The addition/subtraction data 134 takes "0" for the addition, and "1" for the subtraction. Four 1-bit data 141 to 144 at the header of the second 32-bit data 140 are the same as the four 1-bit data of the first 32-bit data 130. The Y coordinate data 135 has 14 bits for example to indicate Y coordinates.

The next Y count data 136 has also 14 bits to indicate the number of rows in the Y direction. A shift amount data 145 of the second 32-bit data has 8 bits, for example, to indicate the shift amount in the X direction. The next initial address data 146 has 20 bits, for example, to indicate the address in the memory where a predetermined row pattern data is stored.

For the simplicity of description, the shift amount is not considered for rectangular pattern data.

Figure 11:
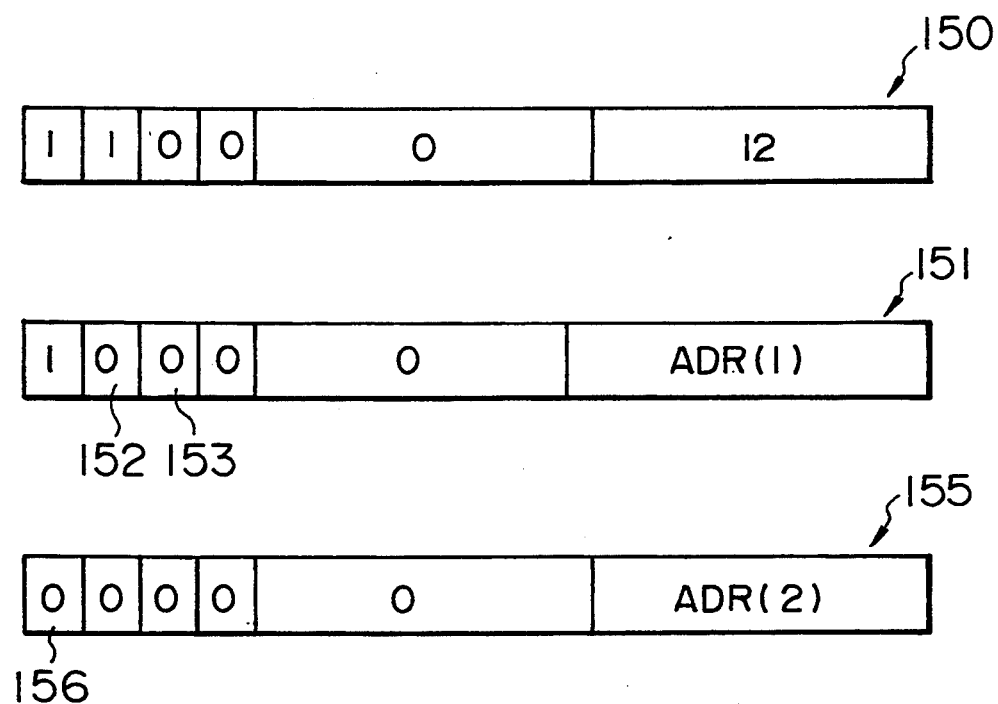
FIG. 11 is a schematic diagram showing an example of sequence data for a combination of rectangular patterns.

FIG. 11 shows an example of sequence data for a combination of rectangular patterns.

Consider a change of each row pattern in the Y direction in obtaining the rectangular patterns shown in FIG. 9B. The same pattern continues from Y=0 to Y=12, another same pattern continues from Y=13 to Y=17, and another same pattern continues from Y=18 to Y=28.

A 32-bit data 150 shown in FIG. 11 indicates that data is from Y: 0 to Y: 12. Two 32-bit data 151 and 155 indicate the contents of the pattern. The 32-bit data 151 has its 1-bit data "0" indicating X data. An address ADR(1) indicates an address where the pattern of "is" from X=4 to X=18 is stored. Namely, the row pattern of the pattern R1 shown in FIG. 9B is designated by this address.

The next 32-bit data 155 designates an address ADR(2) for the second rectangular pattern R2 shown in FIG. 9B, the address ADR(2) indicating the memory address where the pattern of "1s" from X=32 to X=40 is stored. The sequence bit data 156 is "0" indicating the end of the row data. With these data, a row pattern of "is" from X=4 to X=18 and from X=82 to X=40 is formed and repeated 12 rows.

At Y=13, the pattern R1 is subtracted and only the pattern R2 is repeated to Y=17. At Y=18, the pattern R3 is added to repeat the same row pattern up to Y=28.

In the above example, a rectangular pattern is generated using a row pattern. Any desired pattern may be generated using a row pattern.

Figure 12:
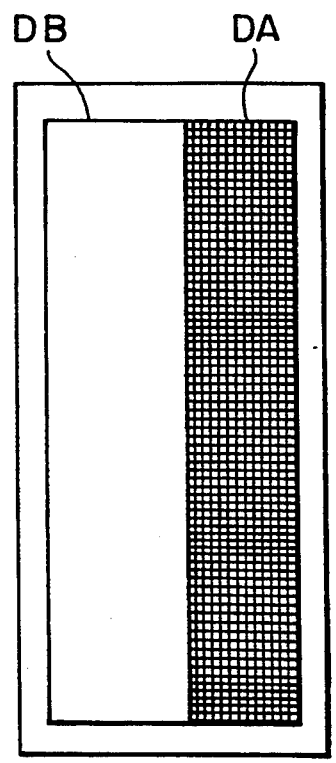
FIG. 12 is a plan view showing an example unit pattern data.

By generating such a rectangular pattern and reading the bit pattern data, an area DA such as shown in FIG. 12 can be exposed by reading a repetitive pattern, and an area DB can be exposed by generating rectangular patterns.

A method of forming a rectangular pattern is not limited to the above examples. For example, a rectangular pattern may be formed on a bit map using the information of start and end points, and reading it like a repetitive pattern.

Figure 16:
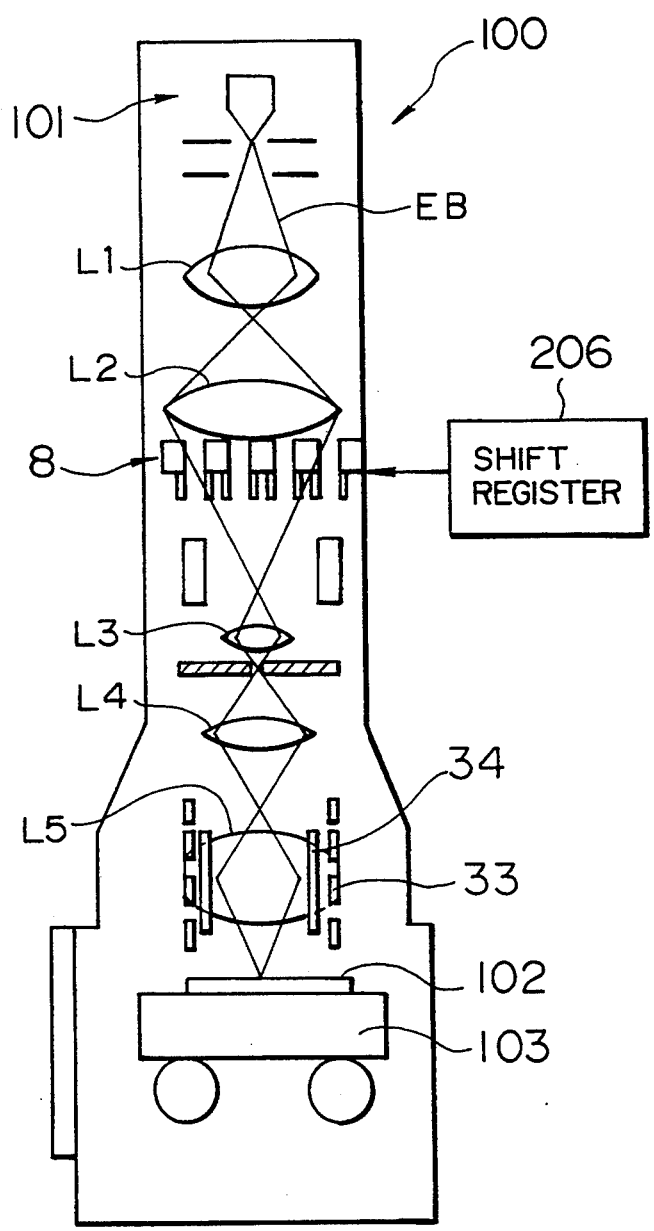
FIG. 16 is a diagram showing the structure of an exposure apparatus dedicated to BAA exposure.

FIG. 16 shows the structure of an exposure apparatus dedicated to BAA exposure. In this exposure system, an electron beam EB emitted from an electron gun 101 is applied to a blanking aperture array 8 via electromagnetic lenses L1 and L2. The blanking aperture array 8 has the structure shown in FIG. 14A, and the transmission/interception of the electron beam is controlled independently at each aperture.

The patterned electron beam at blanking aperture array 8 passes through lenses L3, L4, and LS, and selectively exposes an EB resist film on the surface of a wafer 102 placed on an XY table A main deflector 33 is formed by four pairs of saddle-shaped coils to control the exposure position of the electron beam EB within a broad area. A sub-deflector 34 is formed by a pair of electrode shown in FIG. 16 and another pair of electrodes (not shown) to control the exposure position of the electron beam within a narrow area at high speed.

A signal for controlling each aperture of blanking aperture array 8 is supplied from a shift register 266 to which connected are scrollers and data developing units having the structure shown in FIG. 1.

For the general knowledge of the blanking aperture array 8, reference may be made to U.S. patent application Ser. No. 851,400 filed Mar. 13, 1992 assigned to the present assignee, which is incorporated herein by reference.

In the above description, an electron beam exposure has been used. It is apparent for those skilled in the art that the same structure is generally applicable to a charged particle beam exposure.

The present invention has been described above in connection with the preferred embodiments. The invention is not limited only to the embodiments, but it is apparent for those skilled in the art that various changes, improvements, combinations, and the like may be made.

We claim:

1. A charged particle beam exposure method in which a subject is exposed to a pattern via scanning by a charged particle beam, wherein the charged particle beam is directed to a blanking aperture array which includes n open/close devices and an input which receives a control signal that corresponds to unit pattern data in bit matrix form having m columns and n rows and derived from the pattern, each open/close device individually operable to allow the charged particle beam to pass therethrough to expose the subject or not allow the charged particle beam to pass therethrough to expose the subject in accordance with the control signal received by the blanking aperture array, thereby to shape the charged particle beam into a plurality of beams passing through the blanking aperture array to expose the subject, the pattern being stored in a pattern memory which stores a plurality of patterns, each pattern stored in the form of a bit map having rows and columns with more than n bits in each row, the method comprising:

selectively designating bit positions of successive n-bit width data blocks of the pattern, each n-bit width data block existing within a row of the pattern as stored in the pattern memory;

successively reading each n-bit width data block from the pattern memory;

forming successive rows of unit pattern data from the successively designated and read n-bit width data blocks, each successive row corresponding to a successively designated and read n-bit width data block;

storing the successive rows of unit pattern data to form unit pattern data in bit matrix form having m columns and n rows;

sequentially supplying the successive rows of unit pattern data to the blanking aperture array as the control signal.

2. A charged particle beam exposure method according to claim 1, wherein the step of selectively designating bit positions of successive n-bit width data blocks further comprises the steps of:

designating bit positions of successive n-bit width data blocks containing data which is different from data contained in the preceding n-bit width data block, bit positions not being designated for an n-bit width data block containing the same data as the previous n-bit width data block; and modifying the data contained in the previous n-bit width data block when the data contained in the successive block is different from the data contained in the previous block.

3. A charged particle beam exposure method according to claim 2, further comprising the step of inverting the unit pattern data before sequentially supplying the successive rows of unit pattern data to the blanking aperture array.

4. A charged particle beam exposure method according to claim 1, wherein a rectangular pattern is stored in the pattern memory as coded rectangular pattern data, the step of selectively designating bit positions of successive n-bit width data blocks further comprises:

designating bit positions of n-bit width data blocks within a row of the coded rectangular pattern data.

5. A charged particle beam exposure method according to claim 4, wherein the step of selectively designating bit positions of successive n-bit width data blocks further comprises the steps of:

designating bit positions of successive n-bit width data blocks containing data which is different from data contained in the preceding n-bit width data block, bit positions not being designated for an n-bit width data block containing the same data as the previous n-bit width data block; and modifying the data contained in the previous n-bit width data block when the data contained in the successive block is different from the data contained in the previous block.

6. A charged particle beam exposure method according to claim 5, further comprising the step of inverting the unit pattern data before sequentially supplying the successive rows of unit pattern data to the blanking aperture array.

7. A charged particle beam exposure apparatus, wherein a charged particle source emits a charged particle beam to expose a subject to a pattern according to a control signal, the pattern represented by unit pattern data and the charged particle beam scanning the subject in a scan direction, the charged particle beam exposure apparatus comprising:

a blanking aperture array to which the charged particle beam is directed and comprising n blanking apertures arranged in rows and an input which receives the control signal, each row extending in a direction which is substantially perpendicular to the scan direction of the charged particle beam, each blanking aperture individually operable to allow the charged particle beam to pass therethrough to expose the subject or not allow the charged particle beam to pass therethrough to expose the subject in accordance with the control signal, thereby to shape the charged particle beam into a plurality of beams passing through the blanking aperture array to expose the subject;

pattern generating means for generating unit pattern data from pattern data so as to form the unit pattern data in bit-matrix form having m columns and n rows, the pattern generating means including:

a pattern memory which stores a plurality of patterns, each pattern containing pattern data in the form of a bit map having rows and columns, a shifter which selectively reads a block of pattern data from a row of a pattern stored in the pattern memory, the block of pattern data having a predetermined bit width, and shifts the block of pattern data a specific number of bits, and a row storage device, having an n-bit width, which receives the shifted block of pattern data from the shifter and stores the shifted block of pattern data, the shifted block being a row of unit pattern data;

a storage device, connected to the pattern generating means, which receives and stores the unit pattern data generate a by the pattern generating means; and data transfer means, connected to the storage device, for selectively accessing n-bit rows of unit pattern data stored in the storage device and sequentially supplying the n-bit rows of unit pattern data to the blanking aperture array as the control signal.

8. A charged particle beam exposure apparatus according to claim 7, further comprises feedback means for feeding back the last row of unit pattern data stored in the storage device to the row storage device of the pattern generating means.

9. A charged particle beam exposure apparatus according to claim 8, wherein the shifter is a shift circuit which shifts bits of one row of pattern data, and the storage device includes row data store means for storing one row of n bits and unit pattern data store means for storing n×m bits of unit pattern data.

10. A charged particle beam apparatus according to claim 9, wherein row bit map information corresponds to the rows of unit pattern data and the pattern generating means further comprises means for adding/subtracting the row bit map information to/from the last row of unit pattern data fed back by the feedback means.

11. A charged particle beam exposure apparatus, wherein a charged particle source emits a charged particle beam that scans a subject to expose the subject to a pattern in accordance with a control signal, the pattern represented by unit pattern data, the charged particle beam exposure apparatus comprising:

a blanking aperture array to which the charged particle beam is directed and comprising n blanking apertures and an input for receiving the control signal, each blanking aperture individually operable to allow the charged particle beam to pass therethrough to expose the subject or not allow the charged particle beam to pass therethrough to expose the subject in accordance with the control signal, thereby to shape the charged particle beam into a plurality of beams passing through the blanking aperture array to expose the subject;

pattern generating means for generating unit pattern data from pattern data so as to form the unit pattern data in bit-matrix form having m columns and n rows, the pattern generating means including:

a pattern memory which stores a plurality of patterns, each pattern containing pattern data in the form of a bit map having rows and columns, a shifter which selectively reads a block of pattern data from a row of a pattern stored in the pattern memory, the block of pattern data having a predetermined bit width, and shifts the block of pattern data a specific number of bits, and a row storage device, having an n-bit width, which receives the shifted block of pattern data from the shifter and stores the shifted block of pattern data, the shifted block being a row of unit pattern data;

a storage device, connected to the pattern generating means, which receives and stores the unit pattern data generated by the pattern generating means; and data transfer means, connected to the storage device, for selectively accessing n-bit rows of unit pattern data stored in the storage device and sequentially supplying the n-bit rows of unit pattern data to the blanking aperture array as the control signal.

* * * * *